SEMICONDUCTOR DEVICE ASSEMBLY WITH TRUE METALLURGICAL BONDS

Filed June 8, 1962

INVENTORS
Mark Weissenstern
Gerald A. S. Wingrove
BY Flehr and Swain
Attorneys 3,256,465
SEMICONDUCTOR DEVICE ASSEMBLY WITH TRUE METALLURGICAL BONDS Mark Weissenstern, Palo Alto, and Gerald Alan Spenser Wingrove, Sunnyvale, Calif., assignors to Signetics Corporation, Sunnyvale, Calif., a corporation of California Filed June 8, 1962, Ser. No. 201,056
5 Claims. (Cl. 317—101)

This invention relates to a semiconductor device assembly and method and more particularly to such an assembly and method in which ultrasonic bonding is utilized.

At the present time, it is the current practice in the semiconductor industry to use a thermocompression bond or, in other words, bonded wires for interconnection between the semiconductor device and the package in which it is mounted. These relatively free floating bonded wires, although connected at both ends, are mechanically unsound. This is because the portions of the wires between the bonds at the end of the wire are inherently free floating and have an ability to move which often causes undue stress to be placed on the rigid welds at the ends of the wires and particularly the ends bonded to the semiconductor device. Frequently, the bond to the metallized semiconductor is such that the bonding action itself weakens the mechanical properties of the wire utilized for making the connection. There is, therefore, a need for a new and improved method and means for forming connecting leads to the semiconductors and for connecting these leads to other structures to overcome the above mentioned difficulties.

In general, it is an object of the present invention to provide a semiconductor device assembly and method which makes it possible to overcome the above identified difficulties.

Another object of the invention is to provide an assembly and method of the above character in which very satisfactory bonds can be formed between two rigid substrates.

Another object of the invention is to provide an assembly and method of the above character in which flexible movement cannot occur to fatigue or unduly stress the bonds.

Another object of the invention is to provide an assembly and method of the above character in which the bonds can be readily and economically made.

Another object of the invention is to provide an assembly and method of the above character in which metallized films can be utilized.

Another object of the invention is to provide an assembly and method of the above character in which relatively simple jigs are required.

Another object of the invention is to provide an assembly and method of the above character in which excellent bonds are formed between thin films.

Additional objects and features of the invention will appear from the following description in which the preferred embodiment is set forth in detail in conjunction with the accompanying drawings.

Referring to the drawings.

In general, our semiconductor device assembly consists of a base member which has an insulating layer formed thereon. A thin metallic film is disposed on predetermined areas of the insulating layer. At least one semiconductor device is mounted on the base member. Each of the semiconductor devices has active areas to which thin metallic contacts are secured. The semiconductor devices are positioned on the base member so that the metallic contacts of the semiconductor devices are in engagement with portions of the thin metallic film provided on the rigid base member. The metallic contacts are bonded to the thin film provided on the base member by the use of ultrasonic energy so that electrical contact can be made to the active areas of the semiconductor through the thin film on the base member.

Figure 1:
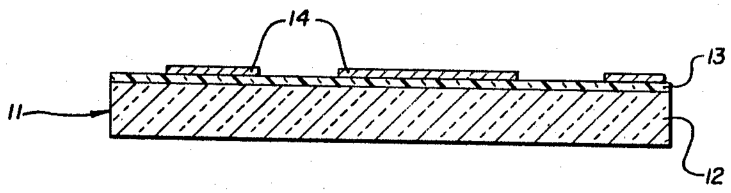
FIGURE 1 is a greatly enlarged cross-sectional view of a substrate having a thin metal film deposited on the same which is utilized as a base member in our semiconductor device assembly as shown in FIGURE 3.

As shown in FIGURE 1 of the drawings, the base member 11 consists of a substrate 12 of any suitable material. However, in order for the base member to be utilized satisfactorily in our invention, it is desirable that the substrate be formed of a relatively rigid material such as quartz-like or ceramic materials. An insulating layer of suitable material 13 is provided on the substrate 12. If the substrate 12 itself is a good insulator, the insulating layer 13 can be eliminated. A thin metal film 14 is provided on the insulating layer 13 in any suitable manner such as by vacuum deposition in a predetermined pattern. Thus, as shown, the thin film 14 does not cover the entire insulating layer 13 but is actually disposed on the insulating layer 13 in a predetermined pattern for use in forming electrical connections as hereinafter described.

Figure 2:
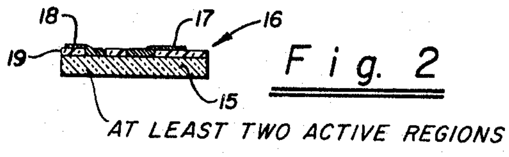
FIGURE 2 shows an enlarged cross-sectional view of a typical semiconductor device.
Figure 3:
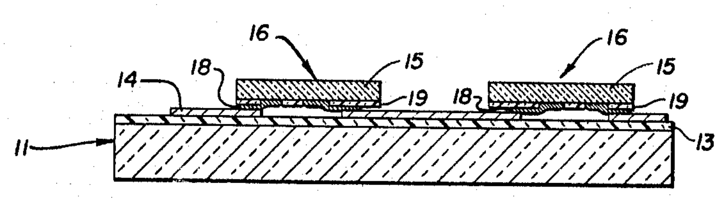
FIGURE 3 is an enlarged cross-sectional view of a semiconductor device assembly incorporating our invention.

In FIGURE 2, we have shown a typical semiconductor device 16, which, if desired, may be a planar structure as shown in FIGURE 2. As is well known to those skilled in the art, such semiconductor devices include active areas or regions in the substrate 15 to which thin film metallic contacts 17 and 18 have been bonded. The regions are contiguous, i.e., in physical contact with each other, to form a junction which extends to the planar surface of the device. It should be pointed out that the pattern of the thin metal film 14 provided on the base member 11 is formed in such a manner that when the semiconductor devices 16 are mounted upon the base member 11, the leads 17 and 18, which may or may not extend over an insulting layer 19 of the semiconductor device, will come into engagement with portions of the thin metal film 14 provided on the base member 11 as shown in FIGURE 3. As will be noted with respect to the right hand device shown in FIGURE 3, if desired, the bond formed between the metal film 14 and the lead 18 may be formed directly over the active area of the device rather than over the insulating layer 19.

In FIGURE 3, we have shown a completed semiconductor device assembly in which a pair of the semiconductor devices 16 have been inverted and mounted upon the base member 11 and which have their leads bonded to the thin metal film 14 so that electrical connection can be made to the active areas of the semiconductor devices through connections made through the thin metal film 14 provided as a part of the base member 11.

Figure 4:
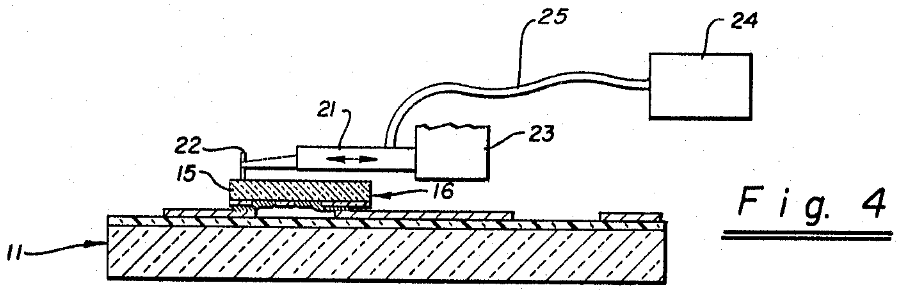
FIGURE 4 is an enlarged cross-sectional view showing the method utilized in forming the bond between the thin metal films in our semiconductor device assembly.

The method or process of forming the bonds utilized in connecting the thin metal leads of the semiconductor devices 16 to the portions of the thin metal film 14 of the base member 11 is shown in FIGURE 4. In performing this method, an ultrasonic transducer 21 is utilized. The transducer that converts electrical energy to very high frequency vibratory mechanical energy in the frequency range between 40 and 100 kc. per second is utilized. One such ultrasonic transducer found to be satisfactory is manufactured by Sonobond Corp. of West Chester, Pa., model W-20TSL. It is supplied with very high frequency from a generating apparatus 24 of a conventional type through a lead 25.

In FIGURE 4, the transducer 21 actually serves as an ultrasonic welding head which is provided with a relatively small pin 22. The transducer 21 serves to introduce ultrasonic vibrations into the pin 22 which are transverse to the longitudinal axis of the pin as indicated by the arrows on the transducer. In performing our method, the transducer 21 is positioned in such a manner that one surface of the pin is placed in engagement with a rigid portion of the assembly and in a position which is opposite the point at which it is desired to form a bond between the two thin metal films, one of the films being the thin metal lead of the semiconductor device and the other being the thin metal film 14 which is a part of the base member 11. With the transducer positioned in the manner shown, the ultrasonic energy is transmitted through the semiconductor device body into the overlapping area of the thin metal leads 18 and the portion of the thin metal film 14 in contact therewith to introduce vibrations in the semiconductor body and in the thin metal films which are parallel to the planes of the semiconductor devices and parallel to the base member 11.

We have found that the application of ultrasonic energy to the thin metal films causes a very localized heating of the surfaces of the thin films in an area of approximately the same area as the face of the pins 22 and in an area immediately opposite the pin 22 to raise the temperature of the same to such a value that a true metallurgical bond is formed between the thin metal films. A jig 23 is provided for holding the transducer 21 to apply a predetermined clamping force so that there is a predetermined clamping pressure between the thin metal films during the bonding operation. A bond will only be formed where two thin metal films are in contact with each other and only in the area immediately opposite the pin 22 or, in other words, only in the area immediately underlying the welding tip. This is because it is only the areas which are immediately under the welding tip which achieves a surface temperature (above 1000° F.) which is high enough to form a true metallurgical weld.

Although we have shown the welding tip applied to the semiconductor body, if desired, the welding tip can be applied to the substrate of the base member 11 opposite the point at which it is to form the weld to achieve a weld in the same manner. After the lead 18 has been bonded to the thin metal film 14, the lead 17 can be bonded to the thin metal film. Thereafter, the other semiconductor device 16 can be inverted and positioned on the thin metal film so that the leads 17 and 18 are in engagement with the portions of the thin metal film. Bonding of the leads can then be accomplished in the same manner as hereinbefore described.

In making such bonds, we have obtained consistently excellent results utilizing a welding tip having a diameter of .002 of an inch and utilizing a pressure of 100 grams for the clamping force. A frequency of 60 kc. per second at power level of one watt was utilized for a period of .3 of a second. These bonds were made using thin films of aluminum which has a thickness of approximately .1 of a micron. As we explained previously, it is believed that satisfactory results can be obtained by utilizing an ultrasonic frequency varying from 40 to 100 kc. per second. The power input to the ultrasonic transducer is dependent upon the applications but can be varied between zero and 10 watts. The length of time required also can be varied between a time very close to zero and one second. The clamping force can be varied from between 10 to 100 lbs. per square inch.

Although we have described the making of the bonds with a welding tip which has an area such that only one bond can be formed at a time, multiple bonds can be made at the same time merely by using a larger tool with a larger welding tip. Thus, where multiple bonds are to be formed simultaneously as, for example, all of the bonds to be made to one device 16, it is merely necessary to use a tip which has a surface area in contact with the device which covers all areas of the device to which bonds are to be made.

In making the bonds between the thin metal films, we have found that it is very desirable that the substrates utilized in the base member 11 and in the semiconductor devices be relatively rigid. For this reason, the insulating layer should also be formed of a relatively rigid material. We have found that the efficiency of transmission of ultrasonic energy in nonrigid substances is insufficient to supply sufficient energy to the weld area to provide an adequate bond. It is, therefore, desirable to utilize materials which have low dissipation for high frequency ultrasonic vibrations in practicing our method.

Although there are a number of parameters which must be chosen to provide proper bonds, we have found that once they have been properly chosen, the welding process can be repeated very consistently to give welds which are of excellent and uniform quality. One of the primary advantages in utilizing such a method for forming the bonds is that we have found that the heating is very localized and, therefore, there is no danger of impairing or destroying the desirable qualities in the semiconductor devices.

We have also found that since the bonds joining the metallic leads and the metallic films are formed between two rigid substrates, the substrates reinforce each other mechanically so relative movement between the same is almost completely eliminated. In this manner, there is no flexing or bending which can cause undue stressing of the bonds which have been formed.

Figure 5:
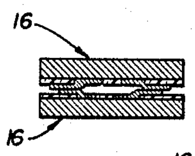
FIGURE 5 is an enlarged cross-sectional view of another semiconductor device assembly incorporating our invention.
Figure 6:
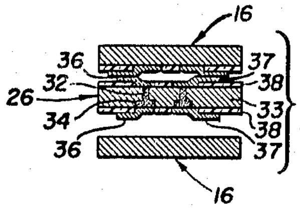
FIGURE 6 is an enlarged cross-sectional view of still another semiconductor device incorporating our invention.

Another of our semiconductor device assemblies is shown in FIGURE 5 and consists of two devices 16 which have their leads bonded together in a manner hereinbefore described so that they are joined into a unitary assembly with their active areas and leads facing each other. Still another of our semiconductor device assemblies is shown in FIGURE 6 and shows multiple semiconductor devices stacked one above the other and having their leads bonded together in a manner hereinbefore described to provide a unitary assembly. In FIGURE 6, we have shown a device 26 in which channels 32 have been diffused all the way through the substrate 33 and which are in contact with active areas 34. Leads 36 and 37 on opposite sides extending over insulating layers 38 are in contact with the active areas. The use of such a device 26 makes it possible to mount devices on both sides as shown in FIGURE 6. The bonding is accomplished sequentially. It is readily apparent that any number of devices can be stacked in this manner merely by using additional devices 26.

It is apparent from the foregoing that we have provided a new and improved semiconductor device assembly and a method for making such assemblies which has many advantages over devices presently on the market. The method is one in which excellent bonds of a uniform quality can be achieved repeatedly with relatively simple equipment.

We claim:

1. In a semiconductor device assembly, a substrate having at least a portion thereof formed of an insulating material, a thin metallic film disposed in a predetermined pattern on the insulating material and having surfaces lying in a single plane to form a plurality of conducting areas, at least one semiconductor device having a substantially planar surface, the semiconductor device having at least two active regions with two of said regions being contiguous to each other with areas in said planar surface and forming a junction extending to said planar surface, metallic contact elements consisting essentially of conductive metal secured to said areas and making the sole electrical connection with the active regions, said metallic contact elements having surfaces lying in a single plane, the semiconductor device being positioned on the substrate so that said surfaces of the metallic contact elements are facing said areas of the thin metallic film on the substrate and are in engagement therewith, and true metallurgical bonds formed between said metallic contact elements and said thin metallic film on the substrate to join the substrate and the semiconductor device into a unitary assembly and so that electrical contact can be made to the active regions of the semiconductor device through the thin metallic film on the substrate.

2. In a semiconductor device assembly, a relatively rigid base structure, at least a portion of the base structure being formed of an insulating material, a thin metallic film disposed on the insulating material in a predetermined pattern and having surfaces lying in a single plane to form a plurality of conducting areas, a plurality of semiconductor devices, the semiconductor devices comprising at least one body having a substantially planar surface and also having at least two active regions with two of said regions being contiguous to each other with areas in said planar surface and forming a junction therebetween extending to said planar surface, metallic contact elements consisting essentially of conductive metal carried by the body and making contact to said active regions through said areas and making the sole electrical connections to the active regions, said metallic contact elements having surfaces lying in a single plane, said semiconductor devices being positioned so that said surfaces of the metallic contact elements face and are in engagement with said areas of the thin metallic film, and true metallurgical bonds formed between the metallic contact elements and the thin film in regions of said surfaces so that electrical contact is made to the regions of the semiconductor devices through the thin metallic film on the insulating material, said bonds serving to bond the semiconductor devices and the base structure into a relatively rigid unitary assembly to thereby inhibit stressing of the bonds.

3. In a semiconductor device assembly, a relatively rigid base structure, at least a portion of the base structure being formed of an insulating material, a thin metallic film disposed on the insulating material in a predetermined pattern and having surfaces lying in a single plane to form a plurality of conducting areas, a plurality of semiconductor devices, each of the semiconductor devices having a substantially planar surface and also having at least two active regions with two of said regions being contiguous to each other with areas in said planar surface and forming a junction therebetween extending to said planar surface, metallic contact elements consisting essentially of conductive metal secured to said areas of said semiconductor devices and having portions lying in a common plane, said metallic contact elements making the sole electrical contact with the active regions and having surfaces lying in a single plane, the semiconductor devices being positioned so that said surfaces of the metallic contacts face and are in engagement with said areas of the thin metallic film that is disposed on the insulating material, and true metallurgical bonds formed between said metallic contact elements and the thin film in the regions of said surfaces so that electrical contact can be made to the regions of the semiconductor devices through the thin film and so that the semiconductor devices and the base structure are bonded into a rigid unitary assembly.

4. In a semiconductor device assembly, a pair of semiconductor devices, each of the semiconductor devices having a substantially planar surface and also having two active regions with areas in said planar surface, thin metallic contact elements consisting essentially of metal secured to said areas of each semiconductor device and having surfaces lying in a single plane and making the sole electrical contact with the active regions, the devices being stacked one above the other with said surfaces of one semiconductor device facing and being in engagement with said surfaces of the other semiconductor device, and true metallurgical bonds formed between said metallic contact elements in the regions of said surfaces to bind the semiconductor devices into a relatively rigid unitary assembly.

5. In a semiconductor device assembly, a plurality of semiconductor devices, each of said devices having a substantially planar surface and two regions with areas in said planar surface, thin metallic contact elements consisting essentially of metal secured to said areas in said planar surface and having surfaces lying in a single plane, at least one of said devices having a conducting channel extending from one of the active regions to the other side of the device and an additional thin metallic contact element secured to the conducting channel on said other side, said devices being stacked one above the other so that said surfaces of the metallic contact elements of one device are in contact with the corresponding surfaces of at least one other device, and true metallurgical bonds formed between said portions in contact with each other to bind the devices into a unitary assembly..

References Cited by the Examiner

UNITED STATES PATENTS

| | | | |
|---|---|---|---|
| 2,981,877 | 4/1961 | Noyce. | |
| 3,029,366 | 4/1962 | Lehovec | 317—101 |
| 3,052,822 | 9/1962 | Kilby | 317—101 |
| 3,059,320 | 10/1962 | Seabury et al. | 20—155.5 |
| 3,079,672 | 3/1963 | Bain et al. | 29—155.5 |
| 3,122,680 | 2/1964 | Benn et al. | 317—101 |
| 3,124,640 | 3/1964 | Armstrong | 317—234 |
| 3,134,935 | 5/1964 | Parsons | 317—101 |
| 3,150,299 | 9/1964 | Noyce | 317—101 X |
| 3,178,804 | 4/1965 | Ullery et al. | 317—101 X |

ROBERT K. SCHAEFER, *Primary Examiner.*

JOHN F. BURNS, KATHLEEN H. CLAFFY, *Examiners.*

J. G. COBB, W. C. GARVERT, *Assistant Examiners.*